(12) United States Patent
Gutierrez

(10) Patent No.: US 6,691,398 B2
(45) Date of Patent: Feb. 17, 2004

(54) ELECTRONIC PACKAGING DEVICE AND METHOD

(75) Inventor: Aurelio J. Gutierrez, Bonita, CA (US)

(73) Assignee: Pulse Engineering, San Diego, CA (US)

(*) Notice: Subject to any disclaimer, the term of this patent is extended or adjusted under 35 U.S.C. 154(b) by 0 days.

(21) Appl. No.: 10/263,900

(22) Filed: Oct. 2, 2002

(65) Prior Publication Data

US 2003/0029031 A1 Feb. 13, 2003

Related U.S. Application Data

(62) Division of application No. 09/947,176, filed on Sep. 4, 2001, which is a continuation of application No. 09/313,820, filed on May 18, 1999, now Pat. No. 6,395,983.

(51) Int. Cl.[7] .................................................. A01S 4/00
(52) U.S. Cl. ...................... 29/592.1; 29/602.01; 29/827
(58) Field of Search ............................. 29/602.01, 854, 29/827, 592.1

(56) References Cited

U.S. PATENT DOCUMENTS

| | | | |
|---|---|---|---|
| 2,945,163 A | 7/1960 | Kilby | 361/761 |
| 3,791,025 A * | 2/1974 | Guarjado | |
| 4,084,210 A | 4/1978 | Forrest | 361/212 |
| 4,224,637 A | 9/1980 | Hargis | 257/670 |
| 4,402,135 A | 9/1983 | Schweingruber et al. | 29/832 |
| 4,540,907 A | 9/1985 | Hagenblocher et al. | 310/680 |
| 4,783,906 A * | 11/1988 | Gingerich et al. | |
| 4,912,288 A | 3/1990 | Atkinson et al. | 174/251 |
| 5,015,981 A * | 5/1991 | Lint et al. | |
| 5,581,118 A | 12/1996 | Mays | 257/666 |
| 5,889,658 A | 3/1999 | Sullivan et al. | 361/773 |
| 6,089,920 A * | 7/2000 | Farnworth et al. | |
| 6,225,560 B1 * | 5/2001 | Machado | |
| 6,395,983 B1 * | 5/2002 | Gutierrez | |
| 6,512,175 B2 * | 1/2003 | Gutierrez | |

* cited by examiner

Primary Examiner—Carl J. Arbes
(74) Attorney, Agent, or Firm—Knobbe Martens Olson & Bear LLP

(57) ABSTRACT

A device for electrically interconnecting and packaging electronic components and method for manufacturing the device. A non-conducting base member having a component recess and a plurality of specially shaped lead channels formed therein is provided. At least one electronic component is disposed within the recess, and the wire leads of the component are routed through the lead channels. A plurality of lead terminals, adapted to cooperate with the specially shaped lead channels, are received within the lead channels, thereby forming an electrical connection between the lead terminals and the wire leads of the electronic component(s). The special shaping of the lead channels and lead terminals restricts the movement of the lead terminals within the lead channels in multiple directions during package fabrication, thereby allowing for the manufacture of larger, more reliable devices. In another aspect of the invention, the device includes a series of specially shaped through-holes provided within the base member to allow the routing of wire leads there through. The bottom surface of the base member is chamfered to facilitate "wicking" of molten solder up the wire leads during soldering, thereby allowing for a stronger and more reliable joint.

17 Claims, 13 Drawing Sheets

ELECTRONIC PACKAGING DEVICE AND METHOD

RELATED APPLICATIONS

This application is a divisional of U.S. patent application Ser. No. 09/947,176 entitled "ELECTRONIC PACKAGING DEVICE AND METHOD", filed on Sep. 4, 2001, which is a continuation of Ser. No. 09/313,820, filed on May 18, 1999, now U.S. Pat. No. 6,395,983 issued May 28, 2002.

BACKGROUND OF THE INVENTION

1. Field of the Invention

The present invention relates generally to non-semiconductor electrical and electronic elements used in printed circuit board applications and particularly to an improved package and method of packaging microminiature electronic components.

2. Description of Related Technology

Dual in-line chip carrier packages (DIPs) are well known in the field of electronics. A common example of a DIP is an integrated circuit, which is typically bonded to a ceramic carrier and electrically connected to a lead frame providing opposed rows of parallel electrical leads. The integrated circuit and ceramic carrier are normally encased in a black, rectangular plastic housing from which the leads extend.

The continuing miniaturization of electrical and electronic elements and high density mounting thereof have created increasing challenges relating to electrical isolation and mechanical interconnection. In particular, substantial difficulty exists in establishing reliable and efficient connections between fine gauge (AWG 24 to AWG 50) copper wire leads associated with various electronic elements within a given DIP. One particularly useful prior art method of connecting element leads to the lead frame terminals (or interconnecting the leads of two or more electronic elements) is disclosed in U.S. Pat. No. 5,015,981, which is illustrated herein in FIG. 1. Commonly known as "interlock base" technology, this method involves routing the wire lead(s) 2 to an unused lead frame slot or channel 3 located at the edge of the non-conducting base member 10, as shown in FIGS. 1 and 2. Each of these channels is designed to receive a single conductive lead frame terminal 4, which when assembled asserts an inward bias on the package thereby forcing contact between the conductive terminals 4 of the lead frame and the electronic element lead(s) 2; see FIG. 2. This method has also typically utilized a locking mechanism, such as a small tab 12 or extension on the four corner lead terminals 14, 15, 16, 17, which locks into a plastic protrusion 18 of similar dimensions using the spring tension associated with the individual lead terminals 4 of the lead frame 34. Refer again to FIG. 2.

However, while simple, this locking mechanism design suffers from three primary disabilities: (i) the relatively low amount of normal force that the package can sustain during manufacture without dislodging or deforming the locking tabs; (ii) the localization of the resistive or reaction force provided by the locking tabs on the four corners of the package; and (iii) the ability of the tabs to provide resistive force in only one direction. These limitations ultimately translate to restrictions relating to the size of the package that can be reliably assembled. For example, the use of a prior art lead frame 34 and base member 10 as described above works well for 16 pin packages, which typically have a surface area (measured across the top of the package) on the order of 0.1 square inches. When larger packages with more surface area and leads are manufactured, however, the lead frame often dislocates and separates from the base member, thereby allowing for movement and/or loss of contact of the lead frame terminals with the component leads. This reduces the reliability of the final package as a whole, and increases the cost of manufacturing, since more defective or non-conforming devices are manufactured in a given production run. This dislocation and separation is largely a result of the increased downward force associated with transfer molding the larger package. Additionally, as previously noted, the distribution of force in the larger package with respect to the leads is less desirable, since the spacing between the four locking tabs on the corners of the package is increased, thereby allowing greater flexing and distortion of the leads interposed there between. The ability of the lead frame terminals 4 to move in one direction also contributed to device failure in that the potential for misalignment and separation of the lead frame and base.

One "work-around" solution for these problems has comprised the use of an adhesive or epoxy placed between the lead frame terminals 4 and the base member 10 so as to maintain a rigid contact between the two. However, this solution obviates many of the benefits of the interlock base technology by introducing additional process steps, materials, and curing times.

In a somewhat unrelated aspect, the aforementioned interlock base technology suffered from another disability; namely, a significant potential for shearing off of the soldered leads after formation. Specifically, one prior design of the interlock base used a series of "through-holes" 13 designed to accommodate multiple wire leads 2 and facilitate their bonding via a soldering process, as shown in FIGS. 3a and 3b. See also Applicant's pending U.S. patent application Ser. No. 08/791,247, entitled "Through-Hole Interconnect Device With Isolated Wire Leads and Component Barriers" filed Jan. 30, 1997, which is incorporated herein by reference in its entirety. Basically, the wire leads to be joined were twisted and routed through the through-hole so as to protrude from the bottom of the package as shown in FIG. 3a herein. Through-holes having an essentially flat or unchamfered bottom surface were used. During soldering, there was a tendency for the molten solder 19 to form a bubble 20 around the egress point of the leads from the feed-through hole at the bottom surface. This bubble effectively displaced solder from the leads as shown in FIG. 3b, thereby making the formation of the solder joint occur at a position lower on the leads than would occur if the bubble were not present. When the extensive portion of leads was subsequently trimmed, the entire solder joint would sometimes be inadvertently trimmed off as well, thereby potentially resulting in failure of the joint.

Based on the foregoing, it would be highly desirable to provide an improved apparatus and method for connecting a lead frame to a package of any size such that the physical forces associated with molding of the package and soldering of the leads would not result in movement or separation of the lead frame from the interlock base or wire leads disposed within the lead channels. Additionally, such an improved apparatus and method would allow for more complete soldering of any electrical joints located within feed-through holes within the interlock base, thereby reducing or eliminating failure of these joints due to inadvertent removal during processing.

SUMMARY OF THE INVENTION

The present invention satisfies the aforementioned needs by providing an improved microelectronic component package and interconnect device having a plurality of specially shaped lead channels which allow lead terminals to be more rigidly captured therein.

In a first aspect of the invention, an improved microelectronic device base member is disclosed which is fabricated from non-conductive material and includes at least one electronic component recess and a plurality of specially shaped lead channels. These lead channels are adapted to receive specially shaped lead terminals associated with a lead frame such that the lead frame and terminals are restricted from any significant movement within the lead channels during device fabrication. In one embodiment, the shapes of the lead channels and lead terminals is such so as to prevent longitudinal movement of the lead terminals within the channels in either direction, yet facilitate easy assembly. Such an arrangement allows the device to be easily assembled without additional labor or process steps, and also allows the fabrication of larger packages with a high degree of reliability. The disclosed base member also optionally includes a plurality of chamfered through-holes which permit more secure joining of the wire leads of the electronic component(s) when installed within the base member.

In a second aspect of the invention, an improved microelectronic device is disclosed utilizing the aforementioned base member and lead terminals. The device includes at least one electronic component having wire leads which is disposed within the base member, and a plurality of shaped lead terminals received within the shaped lead channels of the base member. The shape of the lead terminals and corresponding channels is such to restrict the movement of the lead terminals (and associated lead frame) within the channels during device fabrication, thereby allowing for constant and firm contact between the component wire leads disposed within the lead channels and the lead terminals. This design accordingly allows the reliable manufacturing of larger devices with a minimum of process steps. The device is also encapsulated in a polymer overmolding.

In a third aspect of the invention, an improved method for fabricating the aforementioned device is disclosed. In one embodiment of the method, the aforementioned base member is formed from a non-conductive material using a molding process. The electronic component(s) and lead frame are also formed. The electronic component is inserted in the recess of the base member, and its wire leads routed through one or more of the lead channels in the base member. Additionally, any wire leads desired to be joined with those of other components are twisted and inserted in the through-holes such that they protrude from the bottom of the base member. Next, the lead frame is mounted on the base member such that the shaped lead terminals are received and locked within the corresponding shaped lead channels, thereby forming a rugged electrical contact between the lead terminals and any wire leads routed in the channels. The base member, wire leads, and lead terminals are then dip-soldered to form permanent electrical joints. The wire leads are trimmed, and the device encapsulated in a polymer overmolding using a transfer molding process. The extensive portions of the lead terminals are then trimmed from the lead frame and formed to the desired shape.

These and other objects and features of the present invention will become more fully apparent from the following description and appended claims taken in conjunction with the following drawings.

DETAILED DESCRIPTION OF THE PREFERRED EMBODIMENT

Reference is now made to the drawings wherein like numerals refer to like parts throughout.

Figure 1:
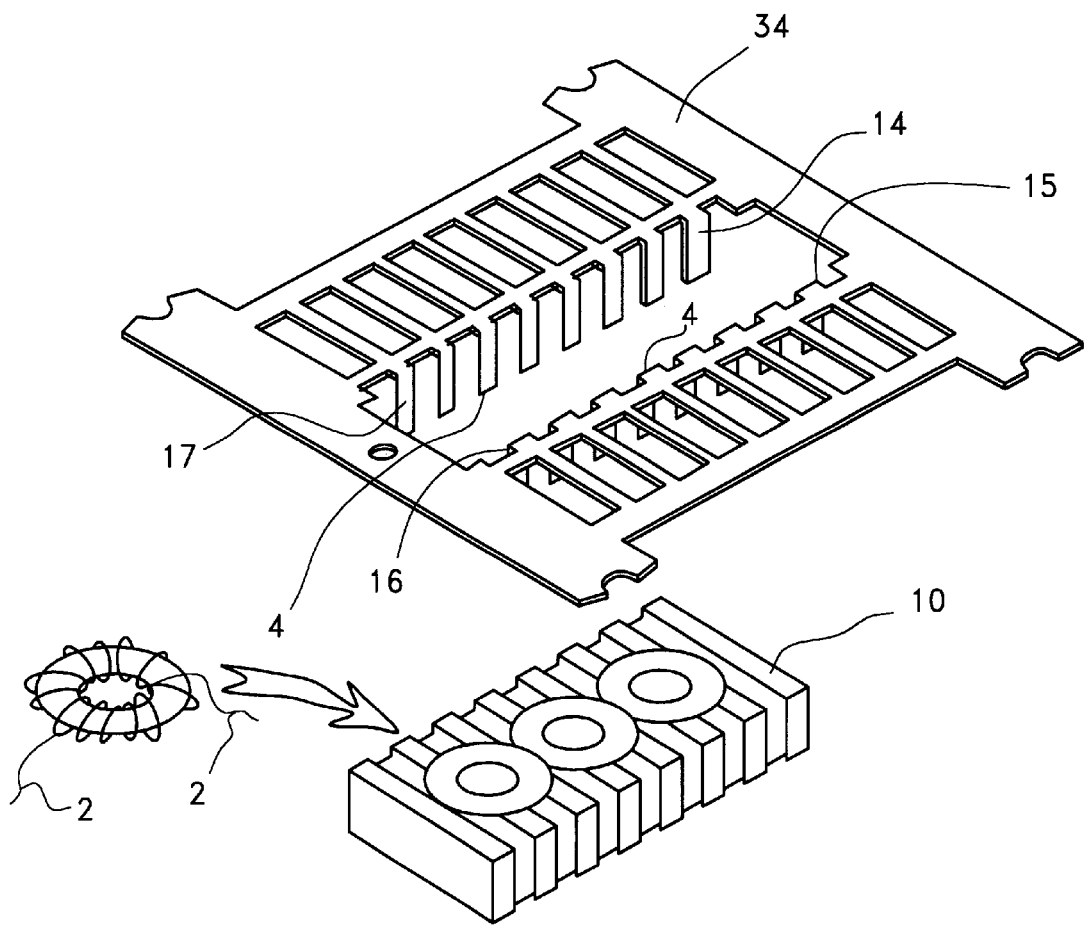
FIG. 1 is a perspective view of a prior art microelectronic packaging device illustrating the relationship between the lead terminals and lead channels.
Figure 2:
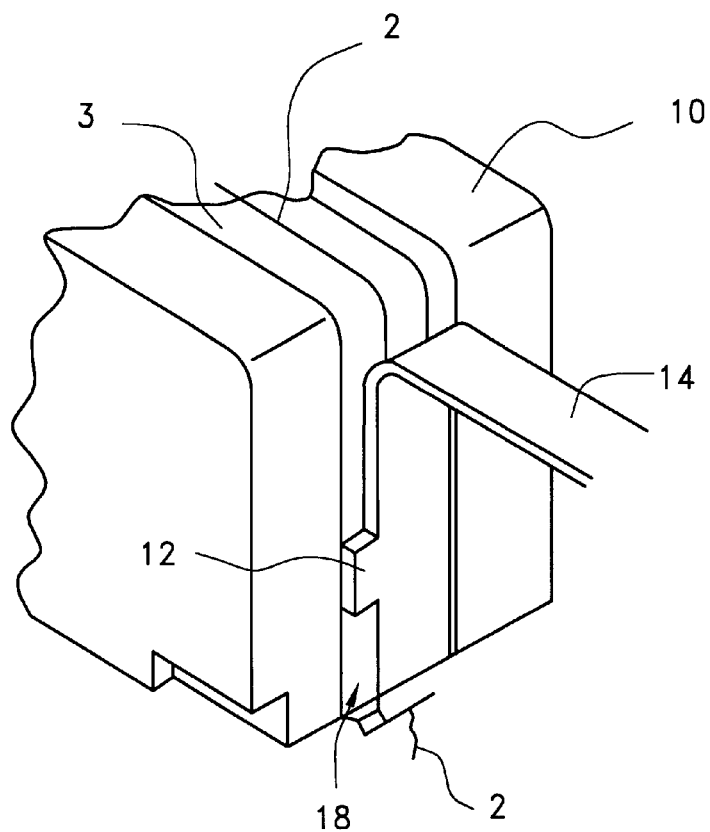
FIG. 2 is perspective view of the prior art device of FIG. 1, illustrating the electrical interconnection between the component lead and lead terminals within a single lead channel, and the locking mechanism associated therewith.
Figure 3A:
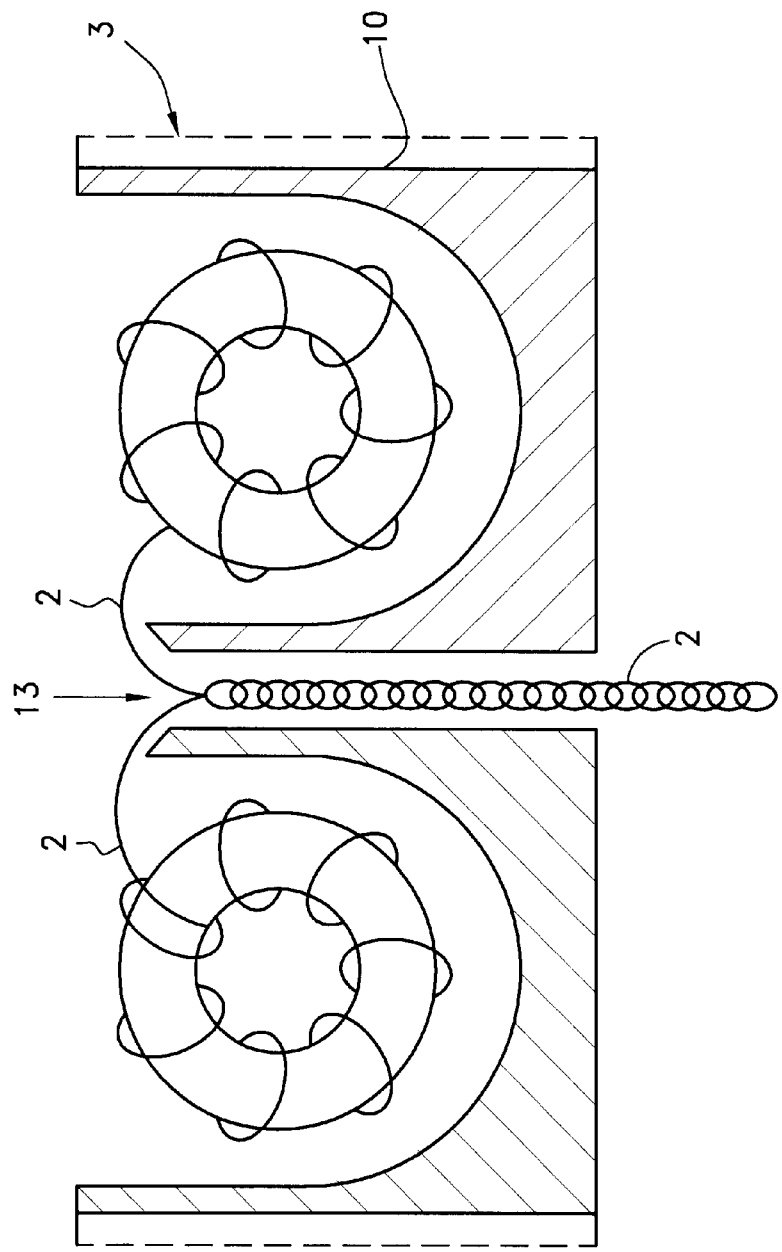
FIGS. 3a and 3b are side cross-sectional views of the prior art device of FIG. 1, illustrating the prior art wire lead through-hole configuration before and after soldering, respectively.
Figure 3B:
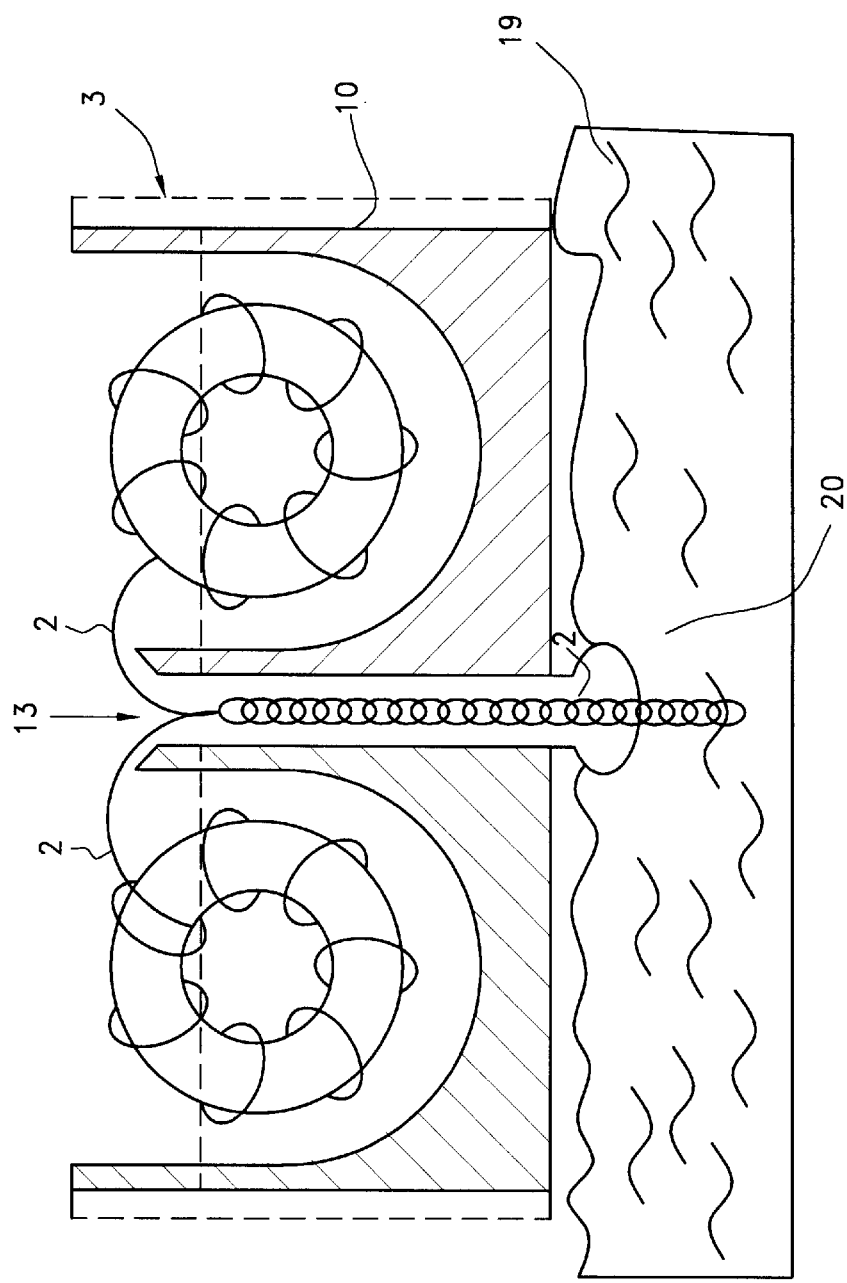
Figure 4:
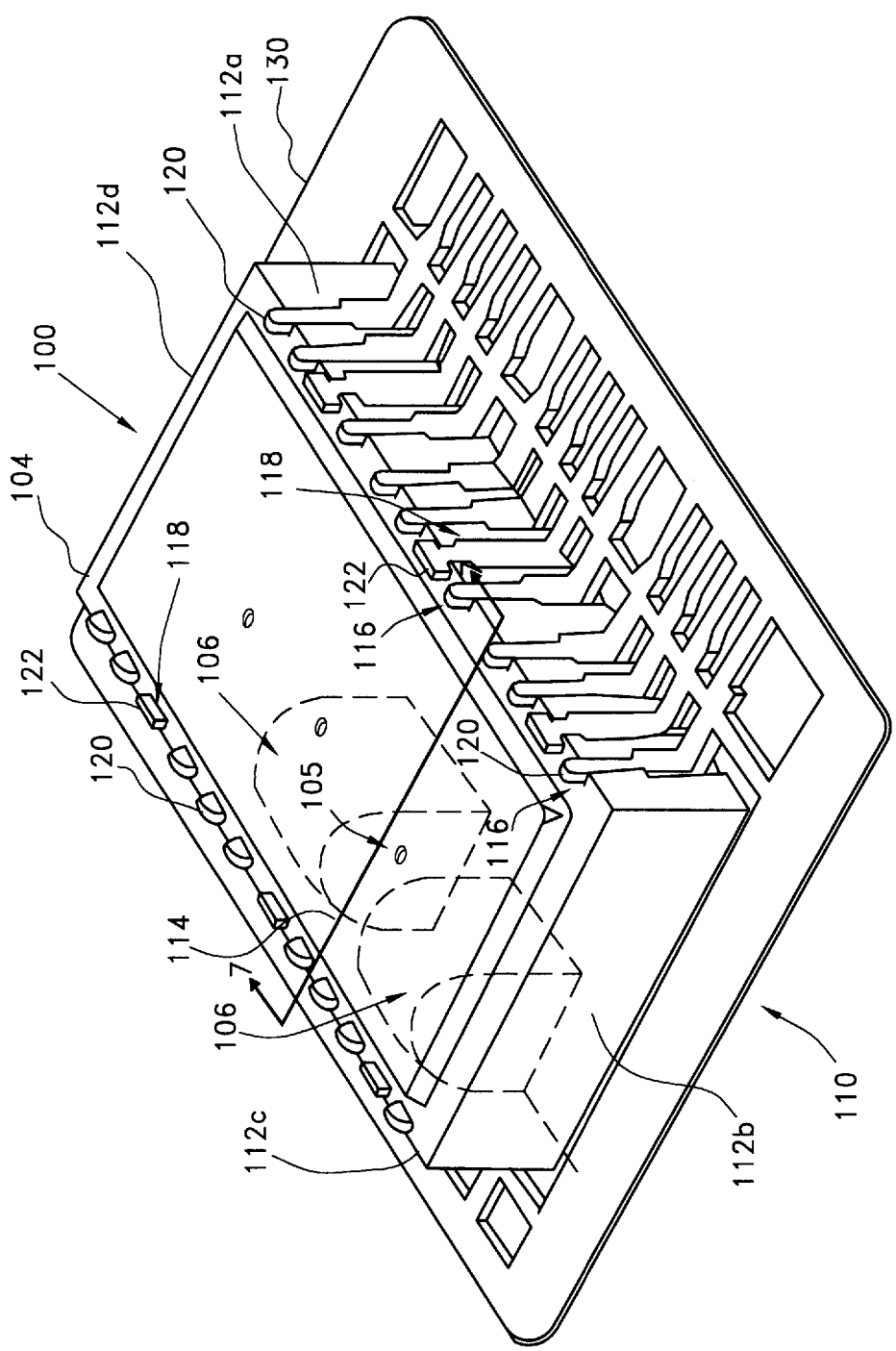
FIG. 4 is a perspective view of a first embodiment of the base member and associated lead terminals of the present invention
Figure 4A:
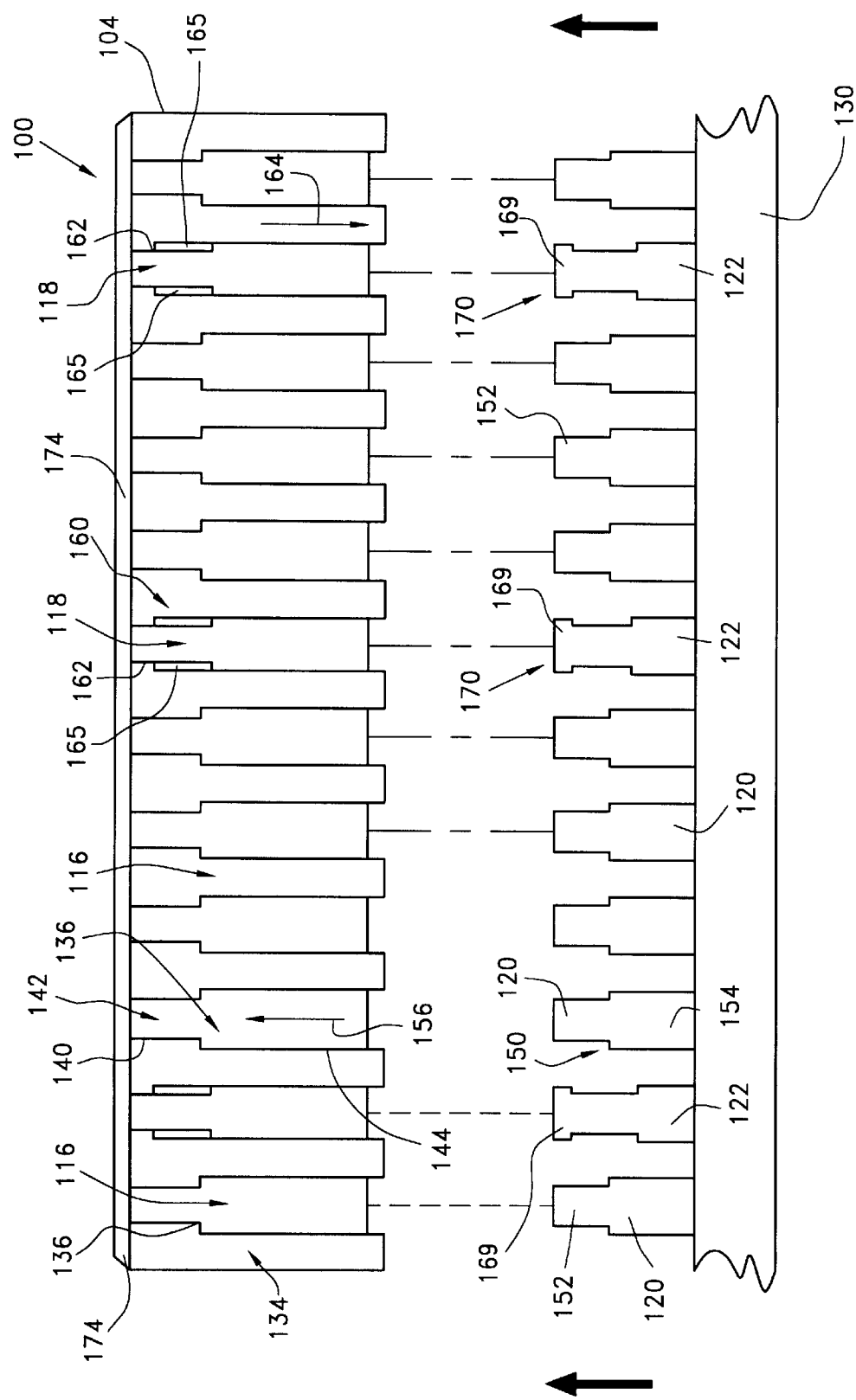
FIG. 4a is detail plan view of the lead channels and lead terminals of FIG. 4.

FIGS. 4 and 4a illustrate a first embodiment of the base member 100 and associated lead terminals 102 according to the present invention. As illustrated in FIG. 4, the base member 100 is comprised generally of a three-dimensional base body 104 having one or more electronic component recesses 106 formed at least partly therein. The body 104 includes a top surface 110, side surfaces 112a–112d, and a bottom surface 114. The body 104 also includes a plurality of first lead channels 116 and a plurality of second lead channels 118 formed within the body 104, described in greater detail below. The base body 104 is ideally fabricated from a non-conductive material such as a liquid crystal polymer using an injection molding process, although other materials and processes may be used. One or more wire lead through-holes 105 are also optionally formed in the base body 104, as described below with reference to FIG. 7. In the present embodiment, the lead channels 116, 118 are disposed on the opposing, elongate side surfaces 112a, 112c of the base body, and oriented in a vertical direction such that the channels 116, 118 run generally from the top surface 110 to the bottom surface 114, and are parallel to one another. This orientation facilitates the routing of wire leads associated with the electronic components disposed in the recesses 106 into the lead channels 116, 118 when the packaging device is assembled; see FIG. 8. The individual recesses 106 are shaped to receive any one of a variety of different electronic elements, such as toroidal induction coils also as shown in FIG. 8. While the discussion presented herein is specific to the illustrated toroidal induction coils, it can be appreciated that a variety of different electronic components may be used in conjunction with the invention with equal success.

As shown in FIG. 4, a plurality of first and second lead terminals 120, 122 are received within the lead channels 116, 118 when the packaging device is assembled. These lead terminals 120, 122 are part of a larger lead frame 130 before being separated therefrom during manufacturing. The use of a lead frame allows all of the lead terminals to be places within their respective lead channels in one processing step, as is described further below. The lead frame 130 (and attached lead terminals 120, 122) of the present embodiment are fabricated from an electrically conductive metal alloy, although other materials may conceivably be used.

Referring again to FIG. 4a, the structure and operation of the first and second lead channels 116, 118 and their associated lead terminals 120, 122 are described. The first lead channels 116 are formed so as to include a first retention element 134. In the present embodiment, the retention elements 134 comprise a shape 136 formed in each or a subset of the first lead channels 116. The shape 136 comprises a narrow portion 140 at the top end 142 of the channel 116, and a wider portion 144 adjacent to and below the narrow portion 140, hereinafter referred to as a "bayonet" shape. A complementary shape 150 in the corresponding first lead terminal 120, having a narrow portion 152 atop a wider portion 154, is formed to permit the lead terminal 120 to engage the lead channel 116 to prevent the lead terminal 120 from moving in a first longitudinal direction 156 beyond a desired point within the lead channel 116 when the terminal 120 and base member 100 are joined.

Figure 4B:
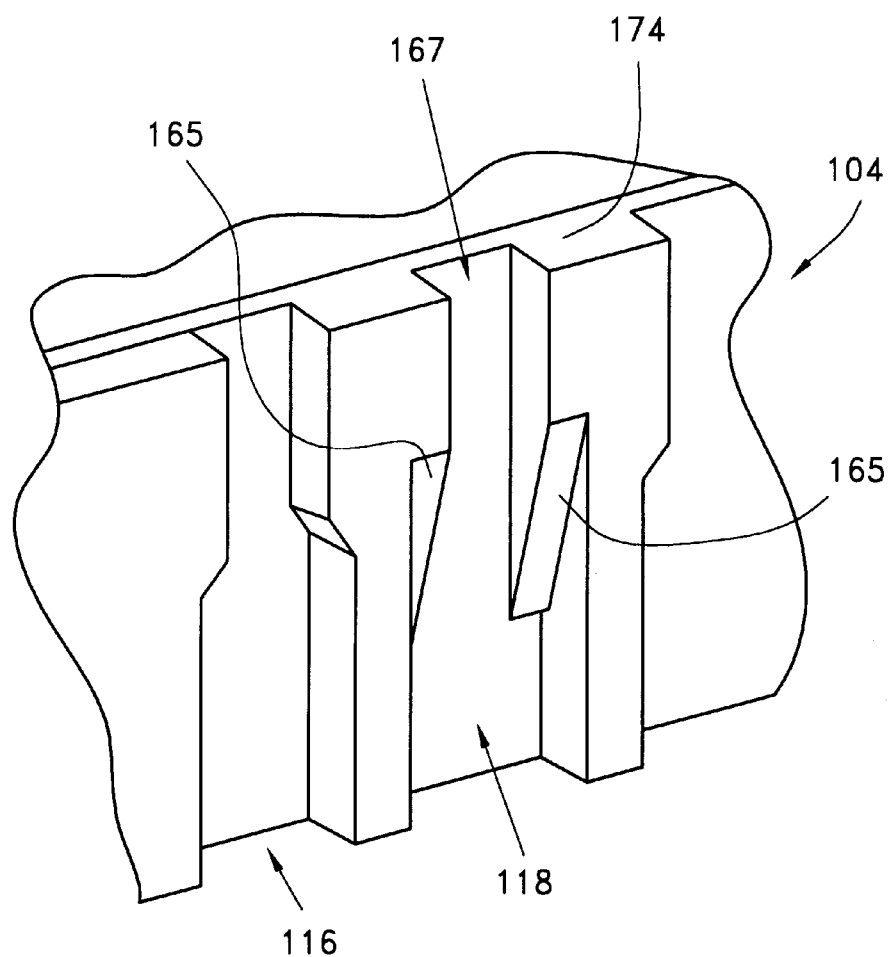
FIG. 4b is a detail perspective view of one of the second lead channels of the base member of FIG. 4, illustrating the "T-bar" arrangement.

Similarly, as shown in FIGS. 4a and 4b, the second lead channels 118 include a retention element 160 in the form of a shape 162, the latter designed to engage the second lead terminals 122 when received within the channels 118. The shape 162 employed in the second lead channels 118, however, is different than that used in the first lead channels 116, so as to allow the lead terminals 120, 122 to be inserted into their respective lead channels 116, 118 from the same direction, yet prevent the movement of the second lead terminals 122 in a second longitudinal direction 164 once inserted. Specifically, the second lead channels 118 use a modified "bayonet" shape having a ramp portion 165 proximate to the top portion 167 of the channel 118, as shown in FIG. 4b. This ramp portion 165 receives and urges a "T-bar" shape 169 formed on the distal end 170 of all or a subset of the second lead terminals 122 in a direction away from the base body 104 when the terminals 122 are inserted into the second channels 118. When fully inserted, the T-bar shape 169 of each terminal 122 engages a shoulder region 174 on the top surface of the base body 104, so as to prevent the withdrawal of the second lead terminals from the second lead channels 118. Since the first and second lead terminals 120, 122 are rigidly connected via the lead frame 130 (prior to severance) as previously described, the interaction of the first lead channels 116 and their corresponding lead terminals 120, and the second lead channels 118 and their corresponding terminals 122, prevent the lead frame from moving substantially in either the first or second longitudinal directions 156, 164 when the terminals 120, 122 are mated to the base member 100. In this manner, the lead terminals (and lead frame) are "locked" to the base member 100 via both the first and second lead channels. Furthermore, the lead terminals 120, 122 are precluded from moving laterally within the lead channels 116, 118 by the close tolerance fit between the terminals and the side walls of the channels.

It is noted that since the lead frame 130 and lead terminals 120, 122 of the present embodiment are constructed of a metallic alloy having some degree of resiliency, the outward deflection of the T-bar shape 169 of the second lead terminals 122 produces an inward bias force resisting such deflection. In this fashion, as the lead frame 130 is being mounted on the base member 100, and the terminals 120, 122 inserted into their respective lead channels 116, 118, a resistive force opposing the movement of the lead terminals 120, 122 longitudinally within the channels is created until the leads (and lead frame) are in their "locked" position, at which point the T-bar shapes 169 are received within the shoulder region 174 of the base body 104. Hence, the lead frame and terminals are designed to "snap" onto the base member in a frictional manner.

Note also that the width of the base body (or alternatively, the depth of the lead channels) may also be varied as a function of vertical position on the base body so as to provide a variable interference fit with the lead terminals. Such a variable fit may be useful, for example, during assembly, so as to permit an assembler to more easily place and align the ends of the lead terminals 120, 122 within the lead channels 116, 118 before sliding the lead frame 130 fully into position.

It is further noted that while the embodiment of FIGS. 4–4b utilizes nine first lead channels 116 which are interleaved or interspersed with three second lead channels 118 on each of the elongate sides of the body 104 in a predetermined pattern, other patterns and combinations of lead channels and associated terminals may be used. For example, first and second lead channels/terminals could be dispersed in on alternating basis (i.e., one first channel, one second channel, one first channel, etc.). Alternatively, the orientation of each of the lead channels could be inverted (i.e., rotated 180 degrees) with respect to the base body 104 such that the lead frame 130 and terminals 120, 122 are inserted onto the top of the body 104 rather than the bottom. Many such variations are possible, and all being considered within the scope of the invention.

Figure 5:
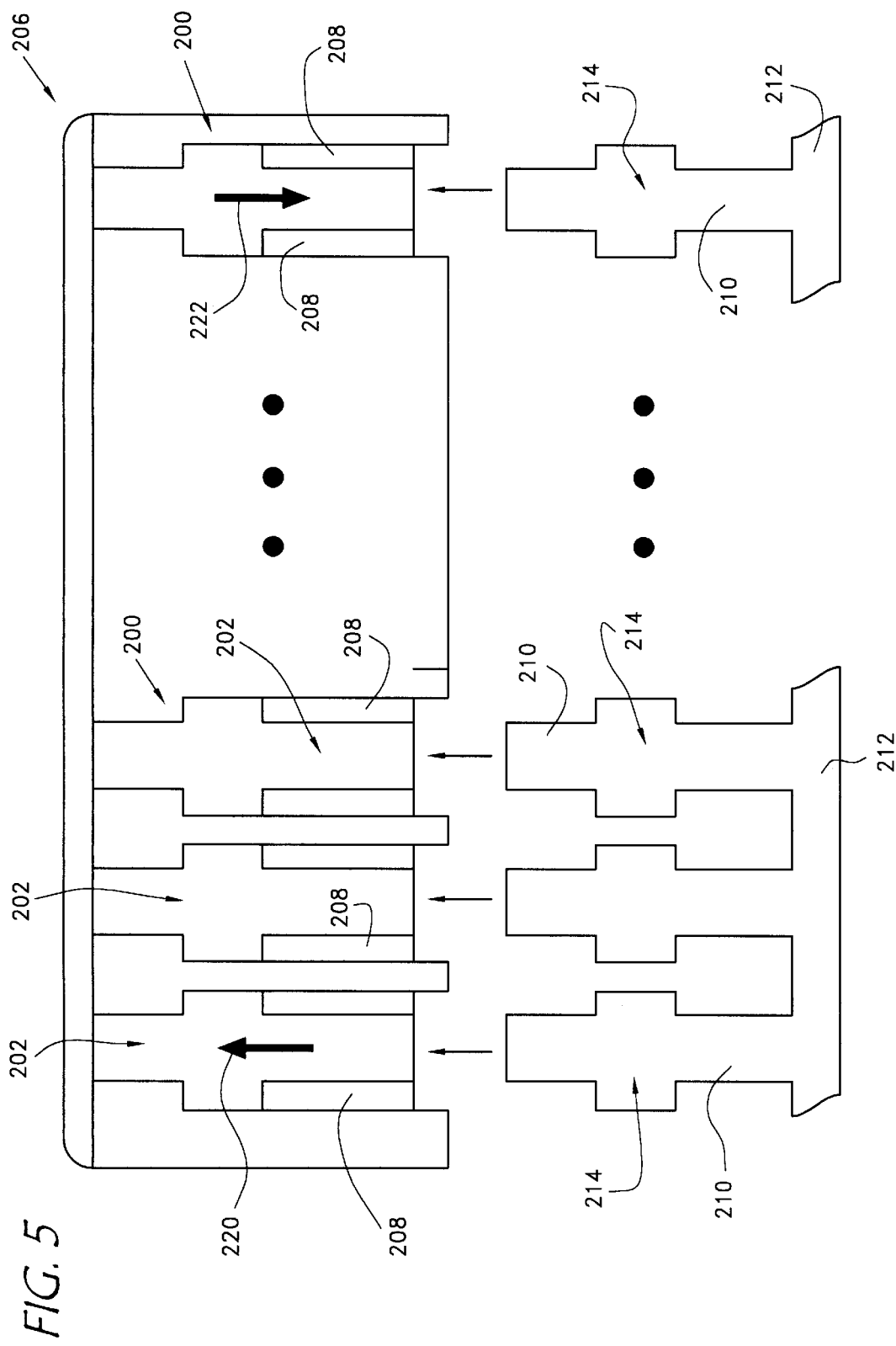
FIG. 5 is a plan view of a second embodiment of the lead channels and associated lead terminals according to the present invention.

Referring now to FIG. 5, a second embodiment of the present invention is disclosed. In this second embodiment, a series of rectangular retention elements 200 are formed within all or a subset of the lead channels 202 of the base member 206. These retention elements 200 are arranged at a given vertical elevations along the sides of the base member for simplicity of manufacturing, although other arrangements may be used. As in the embodiment of FIG. 4, a ramp portion 208 is included within each of the lead channels 202 to facilitate guiding and biasing the lead terminals 210 during mounting of the lead frame 212. When the lead frame 212 is properly positioned on the base member 206, the shapes 214 formed in the lead terminals 210 engage the retention elements 200 in the lead channels 202 so as to restrict movement of the lead terminals within the lead channels in both longitudinal directions 220, 222. As with the embodiment of FIG. 4, the lead frame 212 and base member 206 "snap" together when the lead frame 212 is properly positioned due to the biasing force on the lead terminals 202 and the physical relationship between the components.

Figure 6:
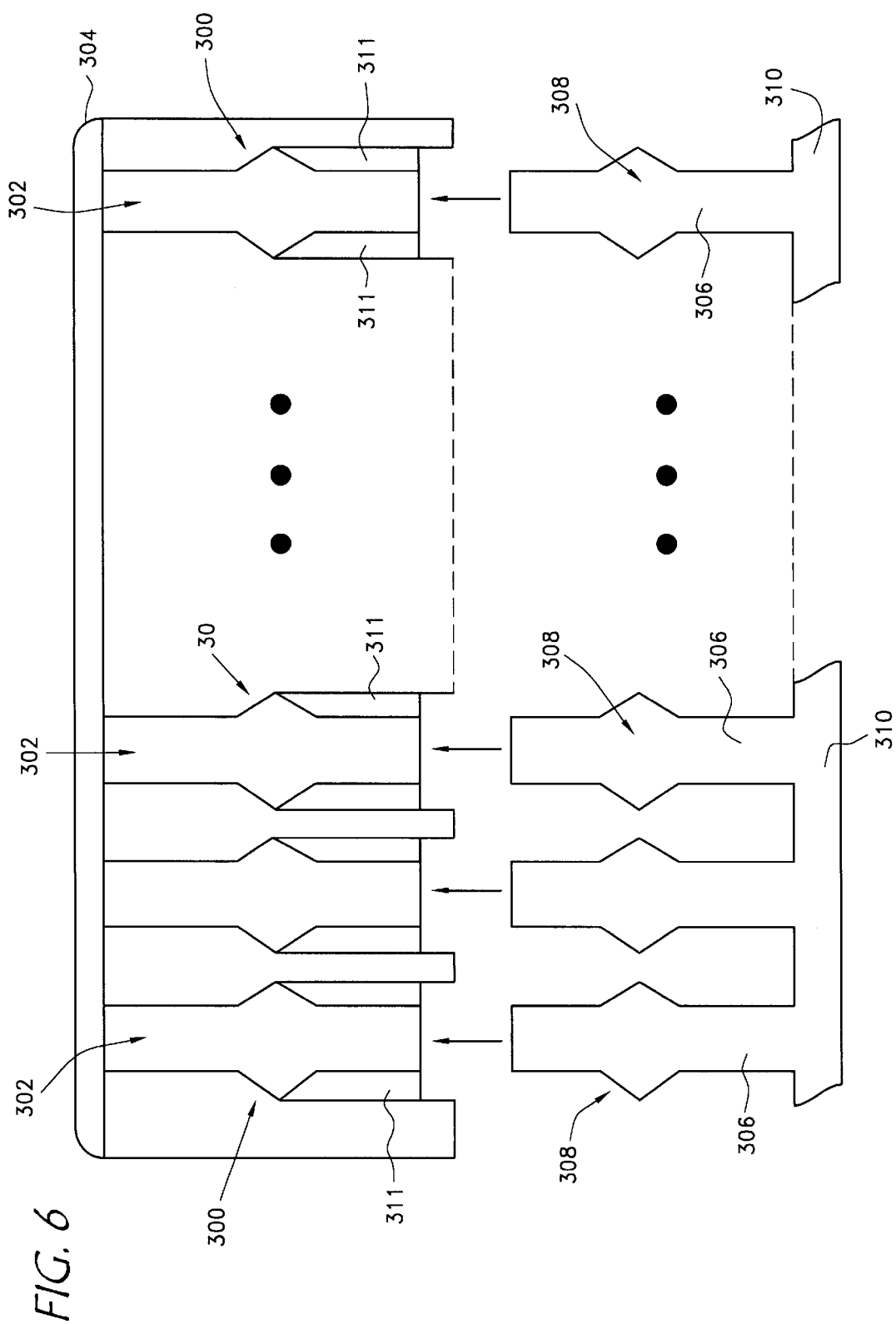
FIG. 6 is a plan view of a third embodiment of the lead channels and associated lead terminals according to the present invention.

FIG. 6 illustrates a third embodiment of the base member and lead terminals of the present invention. In this third embodiment, a series of "notch" recesses 300 are formed within all or a subset of the lead channels 302 of the base member 304. The lead terminals 306 include a corresponding shape 308 formed therein which cooperates with the recess 300 within the respective lead channel 302 to retain the lead terminals 306 in a fixed position when the lead frame 310 is mounted on the base member 304. The fit between the lead channel recess 300 and the shape 308 of the lead terminals is such that the lead terminals again "snap" into their recesses at a desired position, aided by a plurality of ramp portions 311 disposed within the lead channels 302. Longitudinal movement of the lead terminals 306 is restricted by the cooperation of the shapes 308 and the recesses 300.

Figure 7:
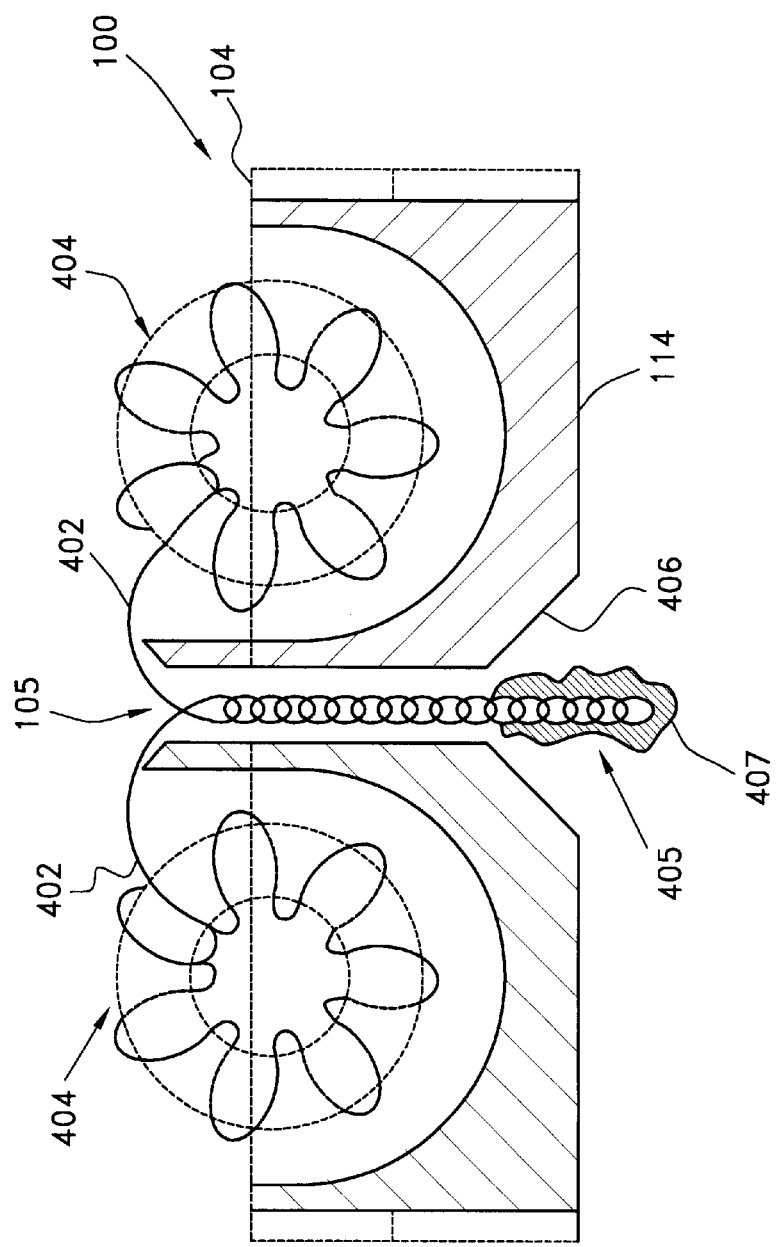
FIG. 7 is a cross-sectional view of the first embodiment of FIG. 4, taken along line 7—7, illustrating the through-hole arrangement of the present invention.
Figure 8:
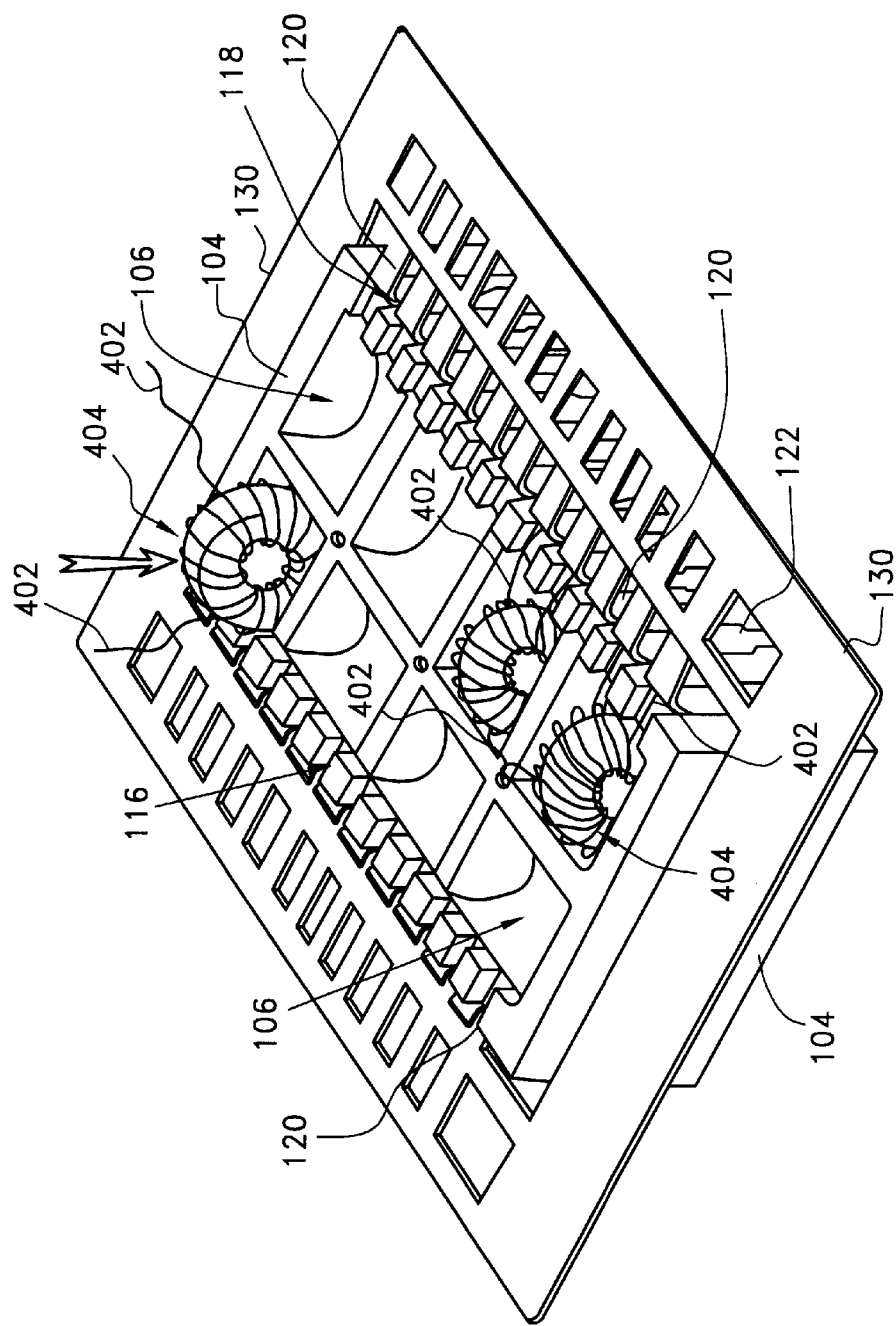
FIG. 8 is a perspective view of the electronic packaging device of the present invention prior to encapsulation, illustrating the placement of the various components with respect to the base member of FIG. 4.

FIG. 7 is a cross-sectional view of the first embodiment of FIG. 4, illustrating the through-hole arrangement of the present invention. The base body 104 includes at least one through-hole 105 disposed within the body 104 so as to facilitate the routing and bonding of the wire leads 402 associated with the electronic component(s) 404 contained within the base member 100. The individual wire leads 402 of the components 404 are joined, such as by twisting them together, and disposing them within the through-hole(s) 105 such that the distal portion 405 of the joined leads extends below the bottom surface 114 of the base body 104. This arrangement facilitates mass soldering of several such joined leads, such as by dip soldering or wave soldering. The through-holes 105 are further provided with a chamfered region 406 disposed adjacent to the bottom surface 114 as shown in FIG. 7. This chamfered region 406 helps preclude the formation of solder bubbles in the area of the through-hole (or alternatively, if a bubble does form, allows the bubble to rise above the plane of the bottom surface 114), thereby allowing solder 407 to "wick" up the joined leads 402 further and above the plane of the bottom surface as well. This approach dramatically reduces the occurrence of inadvertent trimming of the solder joint during subsequent process steps, since the solder joint now extends well into the through-hole 105.

It will be readily appreciated that the number, size, location, and orientation of the through-holes 105 of the present invention may be varied as desired. Furthermore, such through-holes may be used with any of other embodiments of the invention, such as those described with reference to FIGS. 5 and 6 above.

Referring now to FIG. 8, the electronic packaging device of the present invention is now described. As shown in FIG. 8, the device 500 comprises the base member 100 previously discussed with respect to FIGS. 4–4b, lead terminals 120, 122 mounted on a lead frame 130, as well as one or more electronic components 404 having wire leads 402. Note that the device shown in FIG. 8 is in a state of partial completion, prior to encapsulation, and is inverted from that shown in FIG. 4, to better illustrate the relationship between the electronic components 404, wire leads 402, lead channels 116, 118, and lead terminals 120, 122. It will be recognized that while the base member 100 and leads 120, 122 of FIGS. 4–4b are utilized in the device 500 of FIG. 8, other base member and lead terminal combinations may be used with equal success. The embodiment of FIG. 8 is therefore merely illustrative.

The electronic component 404 of the present embodiment comprise an induction coil having a doughnut shaped iron core member 522 around which are wrapped coils of thin gauge wire, with the ends of the wire extending outward and forming terminal ends or leads 402. The components 404 of the present embodiment are disposed within their respective recesses 106 of the base body 104 in such a manner that the central axis of each coil element is aligned with that of all other coil elements as shown in FIG. 8, although it will be appreciated that other orientations and configurations may be used. This arrangement is desirable in that a minimum of space is required to accommodate a given number of components, and field interactions between each component 404 and its neighboring component(s) are generally spatially uniform and consistent from component to component. This assists in distributing any potential (voltage) generated by alternating magnetic or electric fields present during operation more evenly along the windings of each element, thereby increasing overall device longevity and permitting "tuning" of the electrical response of the package as a whole. Note that silicone or adhesive may optionally be used within the recesses 106 to maintain the components 404 in the desired position during assembly of the device 500.

Through-holes 105 of the type described with reference to FIG. 7 herein are also provided in each of the component barriers 526. These through-holes allow the interconnection of leads from the various electronic components 404 installed in the recesses, thereby providing great flexibility in the routing and interconnection of leads during both the design and assembly phases.

Figure 9:
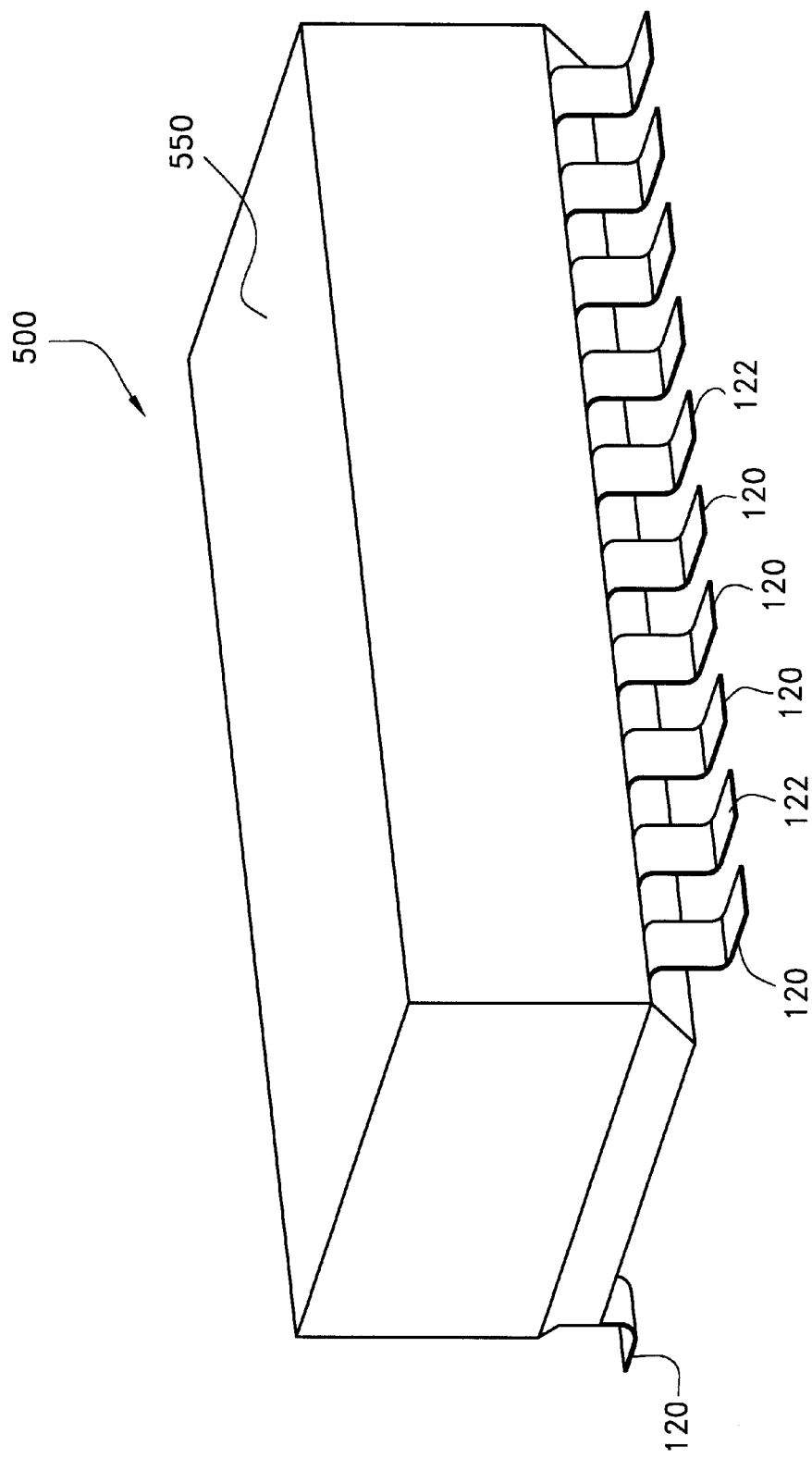
FIG. 9 is a perspective view of the electronic packaging device of the present invention, after encapsulation.

In addition to being joined in the through-holes 105, some of the wire leads 402 of the components 404 are routed into the lead channels 116, 118 of the base member 100 prior to installation of the lead terminals 120, 122 so as to form an electrical contact with the lead terminals 120, 122 when the device 500 is assembled. Both the wire lead/electrical terminal contacts 530, and the joined wire leads 402 disposed within the through-holes, are soldered in order to form a more permanent electrical joint. Ultimately, the device 500 is encapsulated in a polymer encapsulant 550 of the type well known in the electronic arts, and the lead terminals 120, 122 trimmed from the leadframe and deformed to the desired profile as illustrated in FIG. 9.

Method of Manufacturing

Figure 10:
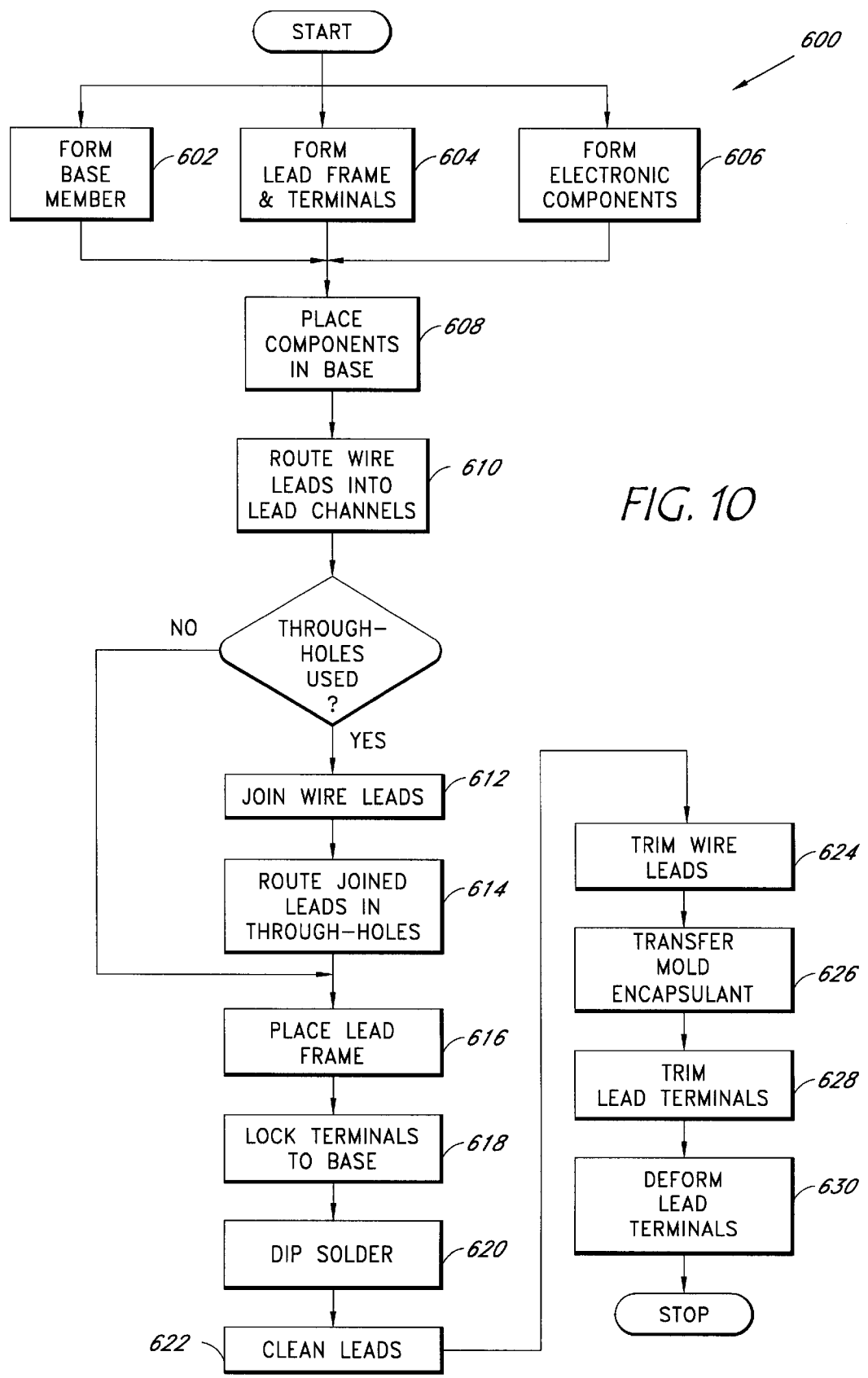
FIG. 10 is a flow chart illustrating one embodiment of the method of manufacturing the electronic packaging device according to the present invention.

The method of assembling the electronic packaging device of the present invention is now described with reference to FIG. 10. In the first process steps 602, 604, 606 of the method 600, the base member 100, lead frame 130, and electronic component(s) 404 are formed using processes well understood in the art. For example, the base member 100 may be formed using an injection molding process, and the lead frame formed from a metal alloy using a stamping and bending process. Many different methods of forming these components are known and may be used with equal success.

Next, the electronic components 404 are placed within the recesses formed within the base member 100 in step 608. A silicone gel or other adhesive may optionally be used to aid in retaining the components 404 in their recesses during subsequent processing. The wire leads 402 of the electronic components are then routed into the lead channels 116, 118 in the next step 610. If the base member 100 includes through-holes 105 such as those previously described, certain of the wire leads of the components 404 are then mechanically joined together (typically, using a twisting or comparable process) in step 612, and then routed into the through-holes in step 614 such that the distal portion 405 of the leads 402 extends below the bottom surface of the base member 100 as shown in FIG. 7. In the next step 616, the formed lead frame 130 is placed on the base member 100 in the proper orientation, and the lead terminals 120, 122 are "locked" into their respective lead channels 116, 118 in the following step 618 as, previously described. The partially assembled device is then soldered, such as by a dip soldering process, in step 620. When the aforementioned solder process is completed, the flux is then cleaned with an isopropyl alcohol using an ultrasonic cleaner or comparable means per step 622. The wire leads (both those routed through the lead channels 116, 118, and those routed into the through-holes 105) are then trimmed as necessary in step 624. In the next step 626, the device is encapsulated in a suitable plastic or polymer material, which material forms a smooth rectangular package as illustrated in FIG. 9. The device is preferably encapsulated in an IC grade thermoset epoxy 550, such as that available from Dexter under the Trademark HYSOL MG25F-05, or equivalent thereof. Thereafter, in steps 628 and 630 respectively, the lead frame is trimmed and formed in a die press or the like to finish the lead terminals 120, 122 in a suitable form, for either surface mounting or pin mounting as desired.

It will be recognized that while the aforementioned method 600 is described in terms of a specific sequence of steps, the order of certain of these steps may be permuted if desired. For example, while the method 600 of FIG. 10 routes the lead wires into the lead channels per a first step 610 prior to joining and routing the lead wires per subsequent steps 612, 614, the order of these two operations may be reversed. Similarly, the formation of the base member, lead frame, and electronic components may occur in series, rather than parallel as shown in FIG. 10. Additionally, it is noted that other process steps may be added, such as for inspection and/or testing of certain components, and other steps optionally deleted (such as those relating to joining and routing the joined the wire leads if no through-holes are employed within the device). Many such permutations and combinations are possible, all being considered within the scope of the present invention.

While the above detailed description has shown, described, and pointed out the fundamental novel features of the invention as applied to various embodiments, it will be understood that various omissions, substitutions, and changes in the form and details of the device or process illustrated may be made by those skilled in the art without departing from the spirit or essential characteristics of the invention. The described embodiments are to be considered in all respects only as illustrative and not restrictive. The scope of the invention is, therefore, indicated by the appended claims rather than by the foregoing description. All changes which come within the meaning and range of equivalence of the claims are to be embraced within their scope.

What is claimed is:

1. A method of manufacturing an electronic device, comprising the steps of:
    forming a three-dimensional base member having at least one electronic component recess, a plurality of first lead channels, and a plurality of second lead channels, said first lead channels having a first shape and said second lead channels having a second shape;
    forming an electronic component having wire leads;
    forming a plurality of first lead terminals, said first lead terminals having a third shape adapted to cooperate with said first shape of said first lead channels;
    forming a plurality of second lead terminals, said second lead terminals having a fourth shape adapted to cooperate with said second shape of said second lead channels;
    disposing said electronic component in said recess;
    routing at least one of said leads into at least one of said first and second lead channels; and
    mating said first and second lead terminals within said first and second channels, respectively, such that said first shape cooperates with said third shape, and said second shape cooperates with said fourth shape, to restrict the movement of said first and second lead terminals within said first and second lead channels, respectively.

2. The method of claim 1, wherein the steps of forming a plurality of first lead terminals and forming a plurality of second lead terminals comprise the act of forming a unitary lead frame having said pluralities of first and second lead terminals disposed thereon.

3. The method of claim 2, wherein the act of forming said lead frame comprises the act of stamping said lead frame from a sheet of metal.

4. The method of claim 2, further comprising separating said first and second electrical leads from said lead frame.

5. The method of claim 1, further comprising exposing at least a portion of said electronic device to solder in order to bond at least some of said first and second electrical terminals to said wire leads of said electronic component.

6. The method of claim 5, further comprising encapsulating at least a portion of said electronic device using a molding process.

7. A method of manufacturing an improved microelectronic device base member, comprising:
    forming a non-conductive base member having at least one recess adapted to house an electronic component, and having a plurality of lead channels;
    forming a first shape within said lead channels;
    forming a lead frame comprising a plurality of lead terminals, wherein each of said lead terminals comprises a second shape adapted to engage said first shape;
    locating said electronic component in said at least one recess, wherein said at least one electronic component has a plurality of wire leads exposed from said recess;
    locating a first of said plurality of wire leads in one of the plurality of lead channels; and
    engaging said plurality of lead terminals with said plurality of lead channels, wherein said first shape of said lead channels engages with said second shape of said lead terminals thereby preventing longitudinal motion of said lead terminals within said lead channels.

8. The method of claim 7, further comprising:
    forming at least one chamfered through-hole in said base member, wherein said through-hole is adapted to accept one or more of said wire leads for electrical interconnecting and is further adapted to facilitate said electrical interconnecting.

9. In an electronic package, a method of preventing motion in a longitudinal direction of a lead terminal in a lead channel having two opposing walls, comprising:
    forming a retaining area in said lead channel by forming a shape on each of said two walls of said lead channel;
    forming a capture area on said lead terminal; and
    inserting said lead terminal into said lead channel, whereby said retaining area cooperates with said capture area on said lead terminal to prevent said lead terminal from moving in said lead channel in said longitudinal direction.

10. The method of claim 9, wherein said lead terminal further comprises two elongated sides and wherein said capture area is formed on both of said elongated sides of said lead terminal.

11. The method of claim 10, wherein said two opposing walls further comprise a first wall and a second wall and wherein said shape on said first wall is substantially the same as said shape on said second wall.

12. The method of claim 10, wherein said retaining area further comprises a narrow portion near an upper end of said lead channel.

13. The method of claim 11, wherein said retaining area further comprises a bayonet shape.

14. The method of claim 10, further comprising:
   forming a second retaining area in an adjacent lead channel; and
   forming a second capture area on an adjacent lead terminal that is adjacent said lead terminal, wherein said second retaining area and said second capture area cooperate to prevent said adjacent lead terminal from moving within said adjacent lead channel in a second longitudinal direction.

15. The method of claim 14, wherein said second retaining area comprises a shape that is different from said retaining area.

16. The method of claim 14, wherein said longitudinal direction and said second longitudinal direction are different.

17. The method of claim 16, wherein said longitudinal direction and said second longitudinal direction are generally opposite directions.

* * * * *